United States Patent [19]

Broadhurst

[11] 4,439,680
[45] Mar. 27, 1984

[54] COLOR-CODED MAPPING SYSTEM AND METHOD FOR IDENTIFYING ELEMENTS IN A SPECIMEN

[75] Inventor: John H. Broadhurst, Minneapolis, Minn.

[73] Assignee: Regents of the University of Minnesota, Minneapolis, Minn.

[21] Appl. No.: 393,031

[22] Filed: Jun. 28, 1982

Related U.S. Application Data

[63] Continuation of Ser. No. 163,219, Jun. 26, 1980, abandoned.

[51] Int. Cl.$^3$ ............................................. H01J 37/00
[52] U.S. Cl. ..................................... 250/310; 250/399
[58] Field of Search ................ 250/306, 310, 399, 397

[56] References Cited

U.S. PATENT DOCUMENTS

| | | | |
|---|---|---|---|
| 3,260,845 | 7/1966 | Duncumb | 250/310 |
| 3,541,233 | 11/1970 | Ayres | 178/5.2 |
| 3,628,014 | 12/1971 | Grubic, Jr. | 250/49.5 A |
| 3,813,545 | 5/1974 | Barnhart et al. | 250/306 |
| 4,041,311 | 8/1977 | Martin | 250/311 |
| 4,068,123 | 1/1978 | Kokubo | 250/310 |
| 4,078,178 | 3/1978 | Lowes | 250/336 |

*Primary Examiner*—Bruce C. Anderson
*Attorney, Agent, or Firm*—Peterson, Palmatier, Sturm, Sjoquist & Baker, Ltd.

[57] ABSTRACT

A particle beam, such as that generated by a scanning electron microscope, impinges upon the specimen to be analyzed. The beam produces X-rays, the energy of which enables the various elements contained in the specimen to be identified. The detected X-ray energy is converted to rectangular electrical pulses, the height of which is proportional to the detected X-ray energy and hence characteristic of the element or elements present in the specimen. The pulse signals are coded so as to trigger or energize the several guns of a conventional color cathode ray tube, such as that used in a color televison receiver. The resulting multicolor map displayed on the screen of the cathode ray tube thus visually indicates to the observer the presence of certain elements and their relative position in the specimen being investigated.

18 Claims, 2 Drawing Figures

COLOR-CODED MAPPING SYSTEM AND METHOD FOR IDENTIFYING ELEMENTS IN A SPECIMEN

This application is a continuation of application Ser. No. 163,219, filed June 26, 1980, now abandoned.

BACKGROUND OF THE INVENTION

1. Field of the Invention

This invention relates generally to a system and method for determining the presence of elements and their distribution in a specimen, and pertains more particularly to the use of a particle beam for producing X-rays characteristic of the elements and a color code for visually identifying the elements in accordance with the position of the electron beam.

2. Description of the Prior Art

X-ray elemental maps using a monochrome cathode ray tube display have been used rather widely for the last eight years or so, and are commercially available from several manufacturers. Such systems currently on the market rely on the processing of an X-ray signal, either with an energy selective detector or a crystal spectrometer, which has been generated by the action of a finely focused electron beam. In such equipment, signals are derived from the X-rays within an energy range corresponding to the excitation of a single elemental species and spots of light are produced at a location on the display which corresponds to the position of the electronic beam. However, all X-ray signals generated by the sample or specimen that correspond to different elements contained in the specimen are lost other than the one selected for investigation. Also, there is no distinction made between fluorescent X-rays, which are characteristic of each element and which are therefore of critical interest, and bremsstrahlung X-rays which represent an unwanted background as far as mapping is concerned and when present to any degree make the fluorescent X-rays, which identify the element or elements, virtually indistinguishable from this background.

Accordingly, nonmapping techniques have been resorted to for simultaneously recording X-rays characteristic of a range of elements. Such techniques make good use of the X-ray information, but the spatial information provided by the electron microscope is degraded because only recording spot measurements or area measurements within the field of display are utilized.

Because of the shortcomings of the techniques alluded to above, sometimes a fully electronic method of simultaneously recording the spatial position of the electron beam and the energy of each X-ray is employed. The disadvantages of this technique resides in the need for accumulating an extremely large amount of data which must be processed and the concomitant problems of recreating a map presentation from such large amounts of digital data. Owing to the fact that techniques of this type involve an inordinate amount of time and cannot provide an elemental concentration map quickly enough to enable decisions to be made as to further measurements from the sample while it is still in the microscope, considerable reluctance is usually experienced with respect to using a system, especially because of the cost of the equipment and the nonuse of such equipment for other projects while the large quantities of data are being processed.

SUMMARY OF THE INVENTION

Accordingly, an important object of my invention is to provide a color-coded display which immediately apprises the operator of the presence of certain elements that the specimen or sample may contain and the spatial location thereof. Also, the invention has for an aim the absolute mapping of any three elements which can be represented by the three primary colors available with the usual three-gun color cathode ray tube. Still further, it is within the scope of the invention to identify various compounds or combination of elements because colors can be combined when practicing my invention to produce shades or hues other than primary colors.

Also, an object of my invention is to provide a color hue, spatial mapping of the specimen being examined in which the colors are user assignable. In other words, the user can select specific colors to represent certain elements that he is looking for, yet being able to change the color code when circumstances dictate or when the user so desires.

Another object of the invention is to prevent X-rays produced by certain elements from being displayed, thereby ensuring that any display of the hue so rejected must be due to a combination of other elements. Alternatively, the continuum of chemical elements is assigned to only a limited region of the hue spectrum, for example, red to green, and a primary hue (in this case blue) assigned to a given element. Consequently, locations on the display of a color in the range of from green to blue will indicate the presence of the selected element. Stated more broadly, my invention possesses a considerable amount of versatility with respect to checking the presence or absence of combinations of such elements.

A very important object of the invention is to provide for all intents and purposes an instantaneous or immediate display of what is present in a given specimen or sample. Where a number of elements are contained in a heterogeneous sample, such a rock formation, a distinct advantage is obtained from the rapid ascertaining and visual mapping of the composition of such formation.

Also, my invention has as an object the physical or morphological display of a substance as well as its chemical composition. For instance, asbestos has long, thin needles, whereas talc does not, even though their chemical composition can be the same; my invention permits the two to be readily distinguished.

Another object of my invention is to enable the resulting map or display to be photographed directly so that a permanent record can be retained of the specimen's composition.

Yet another object is to permit, to a large extent, the utilization of equipment that is readily available and considered standard. More specifically, it is within the purview of the invention to add appropriate circuitry to a conventional electron scanning microscope and a conventional color television receiver, only minor modifications to the television receiver being needed. Accordingly, an aim of the invention is to provide a color-coded mapping system that will be relatively inexpensive because commercially available subcombinations can be incorporated into my system.

Another object of the invention is to permit the use of an electromechanical device for controlling the three primary colors which are, after a suitable code has been selected, representative of the various elements being investigated, an electromechanical arrangement thus permitting the light beams to be directed onto a photographic medium. Of course, flexibility is derived in that when the system if completely electronic, such as when a tri-color cathode ray tube is utilized, the screen of such tube can be easily photographed as already mentioned.

Also, the invention permits the examination of biological specimens, as well as geological and specimens of other physical origins, biological specimens frequently requiring a rapid check so that the characteristics thereof can be ascertained prior to cell deterioration due to bombardment damage.

A further object of the invention is to provide a color-coded mapping system that can be synchronized with the deflecting system of the scanning electron microscope, or which can be made asynchronous or partially synchronous with respect to the microscope's system.

Briefly, my invention envisages the utilization of a conventional scanning electron microscope for producing analog signals corresponding to the so-called X and Y coordinates of the electron beam as it is moved or scanned over the specimen. In addition, electric pulses are derived from the X-ray energy resulting from the impingement or bombardment of the beam against the specimen, the pulses in each instance having a height proportional to the detected X-ray energy. The detected X-ray energy, as represented by the pulse height, is characteristic of the element's or elements' identification; means are provided for coding the pulse signals so that specific hues or colors are derived, each color being representative of a given element. Inasmuch as a combination of colors can be displayed on a conventional color cathode ray tube, such as that used in color television receivers, shades involving more than one primary color can represent element combinations or compounds. In this regard, frequently it is the overall compound and not specific elements making up such a compound that is of chief interest with respect to the analysis of a particular specimen. Provisions can be made for ignoring or excluding certain elements from the color-coded map so that certain desired elements are displayed more prominently and with better resolution.

BRIEF DESCRIPTION OF THE DRAWINGS

FIG. 1A is placed to the left of FIG. 1B.

DESCRIPTION OF THE PREFERRED EMBODIMENT

Figure 1A:
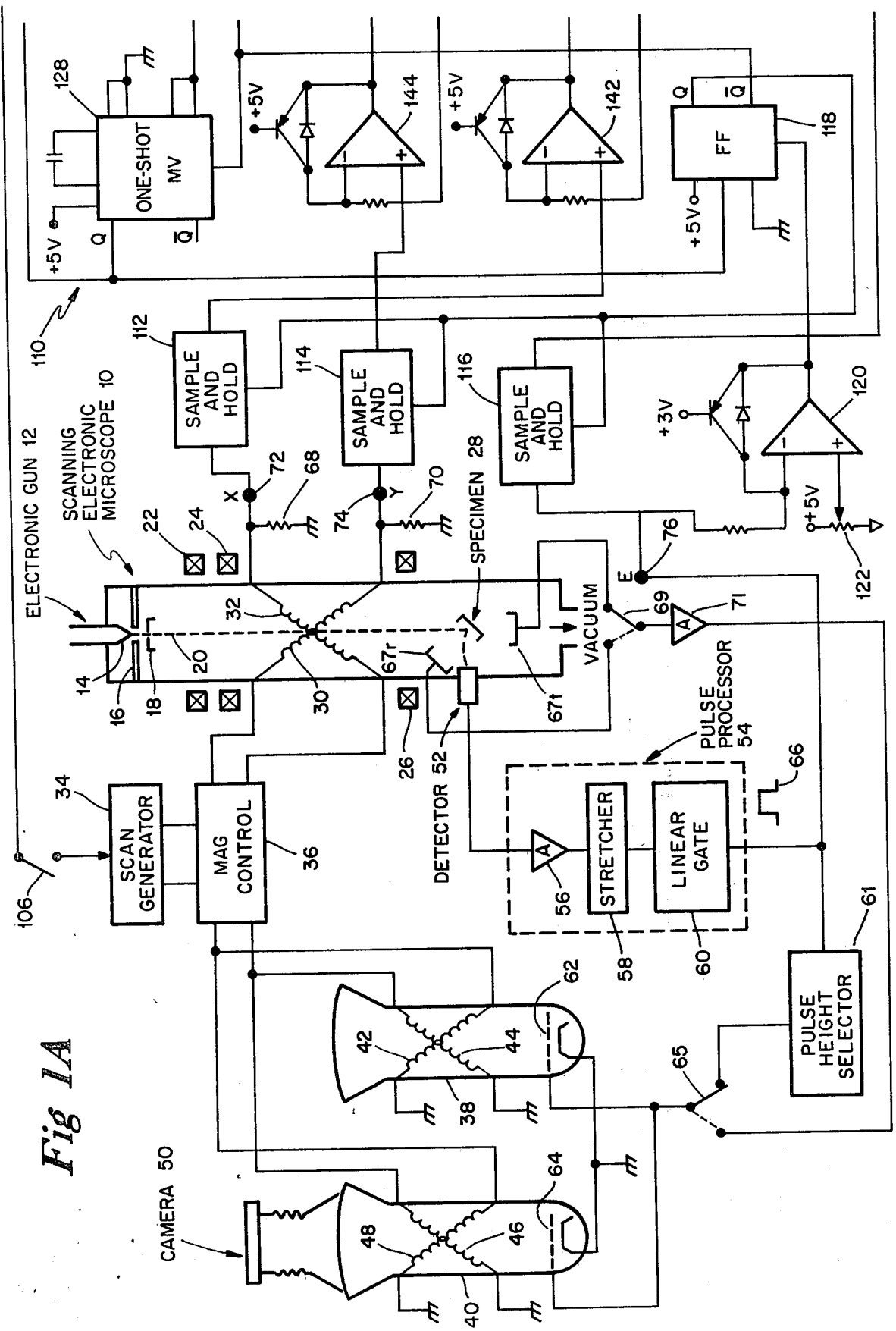
FIGS. 1A and 1B constitute a block diagram exemplifying my invention when

Although scanning electron microscopes are generally well understood, for the sake of completeness FIG. 1A includes a block diagram of a typical scanning electron microscope; this microscope has been denoted generally by the reference numeral 10. The microscope 10 comprises an electron gun 12 which includes a heated filament 14, a grid 16, and an anode 18 in which there is a small hole through which the electrons pass. After passing through the hole in the anode 18, the electrons continue as an electron beam represented by the dashed line 20, moving through first and second condenser lenses or focusing coils 22, 24 and then through a final condenser lens or objective coil 26. It is the final condenser lens 26 that directs the electron beam 20 onto the specimen or sample being investigated, the specimen being labeled 28.

It is within the bore of the final condenser lens 26 that a set of crossed scanning coils 30, 32 is installed in order to deflect the electron beam 20 so that it will scan the specimen 28. In FIG. 1A, however, the coils are not positioned directly within the confines of the condenser lens 26, this being done for drafting reasons. It will be appreciated that the coils 30, 32 are energized from a generator 34 providing a sawtooth waveform similar to that utilized in television receivers, the sawtooth signals being supplied to the scanning coils 30, 32 via a magnification control circuit 36. Actually, all that need be appreciated is that the coil 30 causes the electron beam to move linearly in one direction (horizontal) and may be considered as an "X" coil, whereas the second coil 32 deflects the electron beam 20 at right angles to the direction (vertical) that the X coil moves the beam and may be considered as a "Y" coil. At any rate, the electron beam 20 is caused to scan the specimen 28 by the coils 30, 32.

Usually, two display tubes are associated with a conventional scanning electron microscope; therefore, two cathode ray tubes 38, 40 have been shown. It will be noted that the deflection coils 42, 44 and 46, 48 thereof are controlled by the same scanning generator 34 that has already been mentioned. Whereas the cathode ray tube 38 serves as a viewing tube, the display tube 40 has a camera 50 associated with it for recording the black and white video display depicting a property of the specimen or sample. Unfortunately, the display tubes 38 and 40 can display only three parameters, that is the X and Y positions of the beam 20, plus an indication of the X-ray energy or electron intensity (scattered or transmitted) by virtue of the brightness of the spot or spots on the screens of the tubes 38, 40. When examining X-rays, the brightness, however, does not identify any elements that are present in the specimen 28 other than that one particular element is there if a light spot exists.

The energetic electrons striking or impinging on the specimen 28 either do not interact with the specimen and thus pass on unchanged, or they initiate one or more of the following processes which produce information relative to the properties of the sample or specimen. In this regard, the electron striking the specimen 28 may cause low energy electrons to be ejected from the surface in the form of secondary electrons, thereby enabling a display to be made of the secondary electron map of the specimen's surface. Alternatively, the energetic electron may be deflected by the nuclei of one of the atoms, generating a bremsstrahlung X-ray and in this way being removed from the primary electron beam. Still further, the striking electron may scatter orbital electrons from one of the atoms of the specimen, displaying that electron and itself being deflected. In any event, as the vacant plane in the atom is refilled with an electron, a so-called fluorescent X-ray is generated whose energy is characteristic of the atomic number of the atom. The fluorescent X-ray, more particularly its amount of energy, is indicative of the specific element from which it was produced or generated.

Since it is the energy in each of the fluorescent X-rays that provides the element identification, it is important in a scanning electron microscope to detect that energy. Therefore, a detector 52 has been shown generally in FIG. 1A, constituting an integral component of the microscope 10. While the detector 52 can assume a variety of configurations, one with which I am familiar consists of a large area silicon p-n junction, cooled to liquid nitrogen temperature and reverse biased. In this way, the conduction current is only leakage and minority carrier current, the junction forming a large volume of depleted silicon. When an X-ray is incident on this junction, it interacts with one of the silicon atoms to release a high energy electron. This electron travels a distance through the depleted region transferring its energy to the silicon by creating ionization (electron-hole pairs). These carriers are immediately swept out of the depletion region by the applied electric field, generating a pulse of current as they are collected. The number of carriers collected is proportional to the energy of the electron, which in turn is proportional to the energy of the X-ray. A commercially available detector, such as that just described, is manufactured by Kevex Inc., 1101 Chess Drive, Post Office Box 4050, Foster City, Calif. 94404, the detector being designated as their Model 3000 detector. The current pulse from the detector 52 is integrated to get the total number of carriers, then filtered to optimize the signal-to-noise ratio, and them presented for further analysis by a pulse processor 54, such as Model 4010 also manufactured by Kevex Inc. The processor 54 includes an amplifier 56, a pulse stretcher 58, and a linear gate 60 which standardizes the shape of the pulses forwarded by the detector 52 to a pulse height selector 61, such as Model NC14 manufactured by Harshaw Chemical, 6801 Cochran Road, Solon, Ohio 44139.

It will be noted that the pulse height selector 61 is connected to the grids 62 and 64 of the previously mentioned display tubes 38 and 40 when a switch 65 is set to examine X-rays. Consequently, the pulse, such as that labeled 66, produces a spot or dot on the screens of both of these tubes 38, 40. Inasmuch as the scanning coils 42, 44 and 46, 48 of both of the tubes 38, 40 are controlled by the same scan generator 34 that controls the scan coils 30, 32 of the electron microscope 10, it will be appreciated that the electron beams of both of the tubes 38, 40 are moved in synchronism with the electron beam 20 of the microscope 10 so that there is always correspondence on the screens of the tubes 38, 40 with the position of the beam 20 on the specimen 28 within the microscope 10. Hence, the observer sees the resulting spot or dot in an oriented relation with the specific position of the electron beam 20 striking the specimen 28.

Inasmuch as it is common practice for a user of an electron microscope to look first at electron images before switching over to X-ray maps, my invention retains this capability. Accordingly, the electron microscope 10 also includes two electron collectors 67t and 67r selectively connectible via a switch 69 and current amplifier 71 to the switch 65. When the switch 65 is in its dotted-line position and hence connected to the amplifier 71, and the switch 69 is in its solid-line position and thus connected to the electron collector 67t, then the operator will observe on the viewing tube 38 an electron image produced by electrons transmitted through the specimen 28. On the other hand, when the switch 69 is moved from is solid-line position to its dotted-line position, the switch 65 remaining in its dotted-line position, then the switch 69 is connected to the collector 67r and the user sees an image on the tube 38 produced by those electrons reflected from the specimen 28.

The foregoing description has dealt with commercially-available equipment which lends itself readily to incorporation into my system. This is one of the advantages of my invention because expensive special equipment is not required. Even the ensuing description, which deals with various circuit components providing the color-coded mapping are not individually unique and are also readily available. Further enhancing the attractiveness of my invention and also encouraging its use is the fact that a conventional color television receiver may be utilized.

At this stage it should be mentioned that analog signals corresponding to the X and Y coordinates of the electron beam 20 in the scanning electron microscope 10 are utilized. To provide such signals, resistors 68 and 70 are employed, the analog signal representative of the horizontal of X deflection appearing at a terminal 72 associated with the "X" scanning coil 30 and the analog signal representative of the vertical or Y deflection appearing at a terminal 74 associated with the "Y" coil 32. A third terminal 76 is connected to the linear gate 60. It will be recalled that an electric pulse 66, more specifically a voltage pulse, is provided by the linear gate 60, any such pulses appearing at the terminal 76. It will also be emphasized at this time that the pulse 66 is a rectangular one, having a flat top. It is of relatively short duration, being on the order of only two microseconds. It should be understood, though, that the height of the pulse 66 is proportional to the energy of the X-ray produced by the beam 20 and sensed by the detector 52. It will be appreciated that the pulse 66 represents the energy of one X-ray; similar pulses, either higher or lower, will represent the energy of other X-rays when generated by the beam 20 striking different chemical elements (and also elements within chemical compounds). In actual practice, the signals appearing at the several terminals 72, 74 and 76 are all in the range of from zero to +10 volts.

Figure 1B:
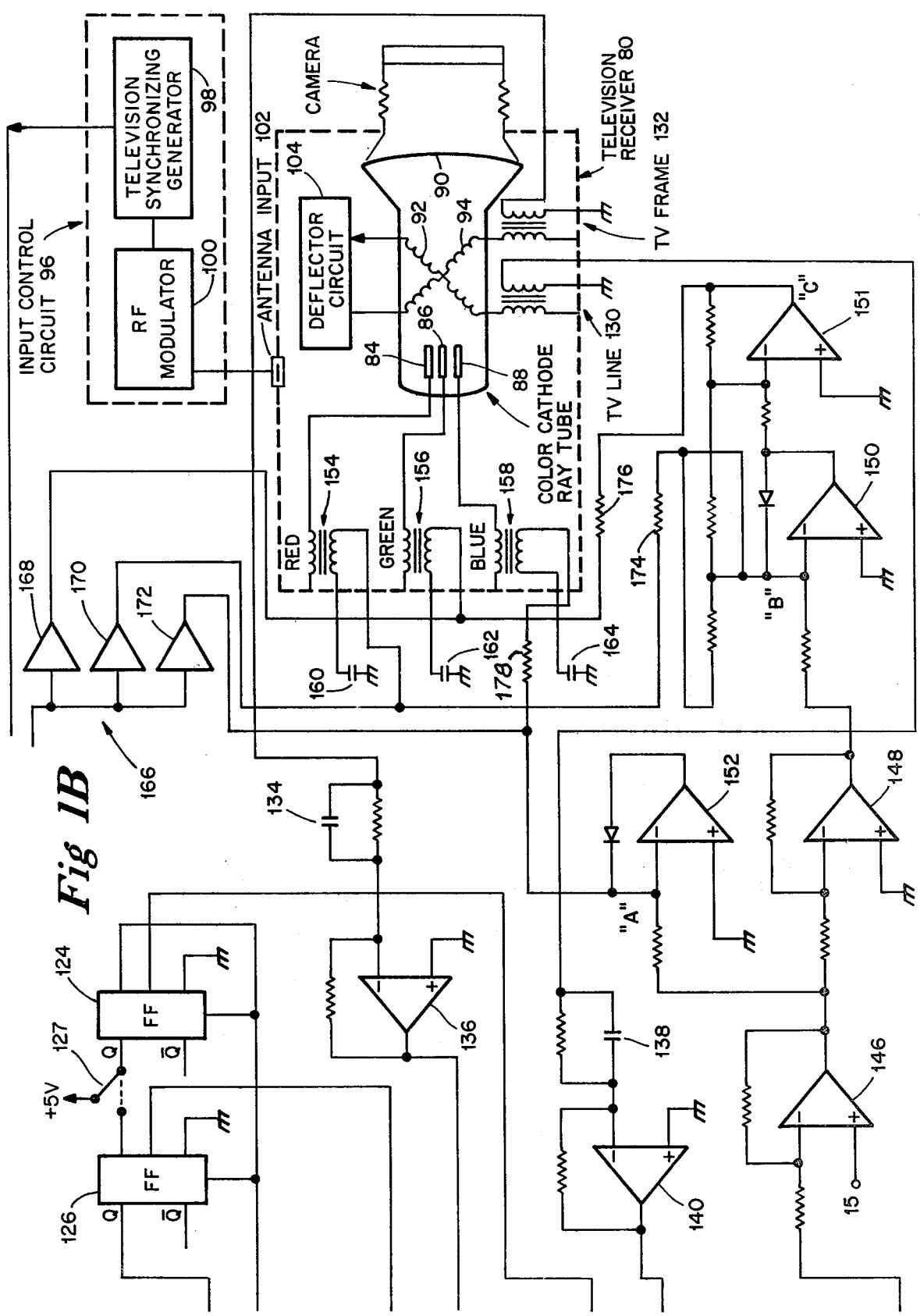

Actually, a complete television receiver need not be utilized and a simplified version thereof appears in FIG. 1B, being designated by the reference numeral 80. In this regard, it will be noted that a color picture tube, that is a cathode ray tube, has been indicated by the reference numeral 82. As is typical with such tubes 82, there are three electron guns 84, 86 and 88 included. These guns 84, 86 and 88 produce three separate electron beams, which move simultaneously in a scanning pattern over a viewing screen 90 to produce a red, green and blue image. To move the three beam properly, scanning coils 92 and 94 are employed, these being included with the color cathode ray tube 82 as purchased and energized from the deflection circuit which is part of the television receiver 80.

The input to the television receiver 80 is an unmodulated radio frequency signal containing the synchronizing information. In one design that has been employed, the input control circuit 96, two integrated circuit chips 98 and 100 have been used, both being manufactured by National Semiconductor Corporation, 2900 Semiconductor Drive, Santa Clara, Calif. 95051. The integrated circuit 98 is a television synchronizing generator, such as type MM 5320 as denoted by National Semiconductor, which circuit 98 produces all of the appropriate waveforms for synchronization. The other integrated circuit 100, such as that designated as LM 1889 by National Semiconductor, functions as a television radio frequency modulator which impresses the synchronizing information onto the antenna input 102 of the television receiver 80. For the sake of simplicity, the processing of the signals within the television receiver will not be described other than that a deflection circuit 104 thereon energizes the scanning coils 92 and 94 to sweep the three beams provided by the guns 84, 86 and 88 over the screen 90.

Although it will not be fully understood at this stage of the description, the field synchronizing generator 98 is connected to the scan generator 34 of the electron microscope 10. If desired, this enables the field scan of the television receiver 80 to be synchronized to the microscope line scan when the system is operating in a semi-synchronized mode, a switch 106 enabling this to be accomplished. The reason for this will become more apparent as the description progresses.

Whereas the scanning electron microscope 10 and the somewhat modified television receiver 80 constitute two important subcombinations of my overall system, it will be helpful to identify the novel color-coding circuitry, which constitutes a third subcombination, by the reference numeral 110. Having prefaced the description of the circuit 110 with the foregoing comments, it can now be pointed out that the circuit 110 comprises three sample and hold circuits or modules 112, 114 and 116 connected to the terminals 72, 74 and 76, respectively. In their quiescent condition, all three of the sample and hold circuits 112, 114 and 116 are in their so-called sample mode, this condition being determined by a flip-flop 118.

First, though, a base line discriminator or comparator 120 has its reference level determined by a potentiometer 122, set at a value above an acceptable noise level. Hence, when an X-ray event occurs, as evidenced by the production of a rectangular pulse 66 forwarded from the linear gate 60, the output from the base line discriminator 120 is polarity reversed when the height of such pulse 66 is above the reference potential determined by the potentiometer 122, thereby setting the flip-flop through its direct clear input. The flip-flop 118 acts as a switch, more specifically providing a "busy" state or a "clear" state according to its particular bistable condition. The point to be made, though, is that the flip-flop sets the sample and hold circuits 112, 114, 116 to their hold state in which state they accept (sample) and retain (hold) whatever signals are forwarded via the terminals 72, 74 and 76. In this regard, the circuits 112 and 114 hold static signals representative of the X and Y coordinates of the microscope beam 20 at the time when the X-ray event occurred, that is, when a pulse 66 is generated. Of course, it is the circuit 116 that retains the signal 66 proportional to the X-ray energy, all as contained in the pulse by reason of its height being in accordance with the amount of X-ray energy experienced at a given amount. None of the above transpires, though, unless the pulse 66 is above the threshold level determined by the reference setting of the discriminator 110.

It perhaps should be explained at this stage that two additional flip-flops 124, 126 and a monostable multivibrator 128 are employed in the circuit 110. Whereas the flip-flop 118 enables the sample and hold circuits 112, 114 and 116 to accept and retain signals from the terminals 72, 74 and 76, the same flip-flop 118 simultaneously clears or releases the flip-flops 124, 126 and the monostable multivibrator 128, allowing these last three components 94, 96 and 98 to become active. The multivibrator 128 provides a short electrical "bright-up" pulse, the reason for which will be better understood hereinafter.

Attention is now directed to the inclusion of current transformers 130 and 132 in series with the scanning coils 92, 94 of the color cathode ray tube 82 that has already been referred to in conjunction with the television receiver 80. The transformer 130 is connected through a high pass RC filter 134 to a current-to-voltage converter 136, the filter 134 providing DC stability. In the same vein, the other transformer 132 is connected through a high pass RC filter for DC stability to a second current-to-voltage converter 140. The potentials from the two converters 136, 140 are at all times compared with the potentials obtained from the X and Y sample and hold circuits or modules 112 and 114.

Consequently, even though a semisynchronous operation is derived by the arrangement just described, it will be appreciated that the coordinate information existing between the scanning electron microscope 10 as far as its electron beam 10 is concerned is compared with the movement of the beams supplied by the three electron guns 84, 86 and 88 of the color cathode ray tube 82. More specifically, what transpires is that the direct clear of the flip-flops 124 and 126 is held arrested in each case until an X-ray event has occurred and output from what will be termed a field comparator 142 sets the flip-flop 126 establishing that the field position is correct and that it is in the forward scan as determined by the signal received by the sample and hold circuit 112 as forwarded via the terminal 72. Once flip-flop 126 has been set, a steering pulse is applied to flip-flop 124 so that the next negative transition from what will be called a line comparator 144 will set flip-flop 124, establishing the correct line position on the forward scan of the beam 20. If the semisynchronous mode is to be employed, then steering is applied continuously to flip-flop via a switch 127.

Setting the flip-flop 124 fires the one-shot multivibrator 128 which generates the "bright-up" pulse (mentioned only generally hereinbefore) for the grids of the electron guns 84, 86 and 88. The trailing edge of the bright-up pulse clears the flip-flop 118, thus releasing the sample and hold circuits or modules 112, 114 and 116 so that they then await the arrival of the next X-ray derived pulse.

The comparators 142 and 144 "look" for positional correspondence between the microscope beam 20 coordinates and the beam position on the television screen 90; coded information is contained in the bright-up pulse supplied by the multivibrator 128. In this regard, a comparator 146 provides a level shift and also a signal inversion so that the lowest energy X-rays produce an output level of $+5$ volts and the highest $-5$ volts. This shifted signal is again inverted by an amplifier 148. From the amplifier 148, all signals go to precision clippers 150 and 152 which remove the negative part of such signals.

The signals from the clippers 150 and 152 have been identified as "A" and "B" respectively. These signals "A" and "B" are summed together at 151 with an offset to produce a signal "C" which is $+5$ volts when $A=B=0$ and is reduced by means of an inverting operation as either A or B become positive.

It will be observed that three pulse tranformers 154, 156 and 158 are connected in circuit with the grids of the cathode ray tube guns 84, 86 and 88. It will also be discerned that a capacitor is connected between one end of the secondary coil of each transformer 154, 156 and 158, these capacitors being identified by the reference numerals 160, 162 and 164.

With the foregoing in mind, attention is now directed to what will be termed a hue modulator denoted generally by the reference numeral 166. The hue modulator 166 comprises three open collector inverters 168, 170, 172 having a high impedance state until the monostable multivibrator 128 is triggered. In this regard, current will flow through resistors 174, 176 and 178, as well as the pulse transformers 154, 156 and 158, thereby changing the capacitors 160, 162 and 164 to potentials equal to the values represented as A, B and C. When the monostable multivibrator 128 is triggered, the inverters 168, 170 and 172 switch to their low impedance state, grounding the sides of the transformers 154, 156, 158 opposite or remote from the capacitors 160, 162, 164. Because of this, the capacitors 160, 162, 164 are quickly discharged through the transformers 154, 156, 158 producing bright-up pulses proportional in height to the initial capacitor charge and hence proportional to the values identified as A, B and C. This method of encoding produces a linear progression around the hue triangle from red (where red equals the lowest X-ray energy) to blue (where blue equals the highest X-ray energy).

In summation, it should be appreciated that the three beams supplied by the guns 84, 86 and 88 are scanned over the screen 90 of the color cathode ray tube 82 and the information obtained from the scanning electron microscope 10 is literally superimposed onto the screen 90 so that the X-ray energy, which is indicative of the properties or characteristics of the element or elements contained in the specimen 28, are displayed on the screen 90 of the tube 82 in accordance with a preselected color code.

Although those familiar with the art will be able to supply the various components included in my circuit 110, nonetheless it may be of some benefit to list components that have been found suitable:

| Reference Numerals | Functions | Manufacturers |
| --- | --- | --- |
| 112, 114, 116 | Sample and hold module | Datel |
| 118, 124, 126 | SN 74107 edge-triggered J.K. flip-flop | Texas Instruments |
| 128 | SN 74122 monostable multivibrator | Texas Instruments |
| 168, 170, 172 | SN 74007 open collector inverter | Texas Instruments |
| 136, 140, 142 144, 146, 148 150, 152 | High-speed operational amplifier L 715 | Fairchild |

I claim:

1. A color-coded mapping system comprising means for producing potentials corresponding to the position of a particle beam as it is moved over a specimen to be analyzed, means for producing a short potential pulse each time an X-ray is detected whose height is proportional to the X-ray energy, means for sampling and holding signals representative of the position of said particle beam as it moves over said specimen, means for sampling and holding the short potential pulse occurring at the time each X-ray is detected, a hue modulator for producing bright-up pulses, a color cathode ray tube including three electron guns, each gun providing a primary color, means for activating said guns including a timing element providing a short electrical pulse enabling said hue modulator to activate said electron guns to produce a spot of light on the screen of said cathode ray tube, said hue modulator causing said electron guns to be activated in accordance with the height of the short potential pulse which represents the amount of X-ray energy, whereby colors are produced at various locations on the screen of said cathode ray tube which represent the elemental composition of said specimen.

2. A color-coded mapping system comprising means for repeatedly directing a beam onto a specimen at various locations to produce X-rays of various energies, the energy of each X-ray which is repeatedly produced at the same location or locations on said specimen being characteristic of at least a chemical element contained in said specimen at said same location or same locations, a detector for detecting the various energies of all of said X-rays that are produced, means connected to said detector for deriving a second beam representative of the energy of said X-rays, including those X-rays that are repeatedly produced at said same location or locations, means responsive to said second beam for producing various colors including a preselected color representative of the X-ray energy characteristic of said element, means for directing said second beam onto a medium capable of providing said various colors including said preselected color, means for moving said first beam from one position to another over an area of said specimen to produce said X-rays of various energies that are detected by said detector, means for moving said second beam from one position to another over an area of said medium in correlation with the positions of said first beam to produce said various colors including said preselected color, said preselected color being visually discernible when repeatedly produced at the same location or same locations on said medium.

3. The system of claim 2 in which said second beam is derived from an electrical signal in the form of pulses, the heights of which pulses are proportional to the energy of said X-rays and said color is preselected in accordance with the pulse height so that said preselected color is representative of the characteristic of said element.

4. A color-coded mapping system comprising the steps of repeatedly scanning portions of a specimen to be analyzed with a particle beam to produce X-rays having various energy levels, certain of which are characteristic of chemical elements that may be contained in said specimen, detecting the energy levels of all of said X-rays produced by said scanned portions to provide pulses of current deriving signals from said pulses of current having values in accordance with said various energy levels including said characteristic energy levels, causing said signals to produce and display various colors representative of all of said energy levels, assigning a recognizable color to those signals having a given value indicative of a particular chemical element that might be contained in said specimen, and displaying all of said colors as they are produced, whereby the repeated production and display of said recognizable color denotes the presence of said particular chemical element.

5. A color-coded mapping method comprising the steps of repeatedly directing a particle beam onto a specimen at various locations to produce various X-rays, the energy of at least one X-ray being characteristic of a chemical element that may be contained in said specimen at one of said locations, detecting said various X-rays to provide signals representative of the energies of said various X-rays at said various locations, deriving various electrical signals from all of said various X-rays having values in accordance with the energies of said various X-rays including a first electrical signal having a value representative of the energy of said X-ray that is characteristic of said chemical element when said chemical element is present at said one location, converting said various electrical signals into various colors representative of the values of said electrical signals including the conversion of said first electrical signal to a color representative of said element when said element is present, said particle beam producing another of said various X-rays when shifted to a second of said various locations on said specimen, the energy of said another X-ray being characteristic of said chemical element when the chemical element at said second location is the same as the element at said one location and the energy of said another X-ray being different when the chemical element at said second location is different from the element at said one location, the deriving of said various electrical signals including the deriving of a second electrical signal representative of the energy of said another X-ray, the converting of said various electrical signals into colors including the converting of said second electrical signal to the same preselected color when said chemical element is the same as that at said one location and to a second preselected color when said element is different from that at said one location, said converting step constituting the conversion of said various electrical signals into a second beam and the directing of said second beam at spaced locations onto the screen of a color cathode ray tube, and photographing the screen of said cathode ray tube to record said various colors.

6. The method of claim 5 in which said various electrical signals are in the form of pulses, the heights of which pulses are proportional to the energy of said X-rays, whereby repeated pulses having said particular pulse heights produce a color indicative of the presence of said chemical element, and repeated pulses derived from said second location having the same height but different from said given height produce a color indicative of the presence of said different chemical element.

7. The method of claim 5 including the step of correlating the locations of said second beam on said screen with the locations of said first beam on said specimen.

8. The method of claim 7 in which said color cathode ray tube includes electron guns for producing the primary colors red, blue and green, said first preselected color constituting one of said primary colors and said second preselected color constituting a second of said primary colors, and the method including the steps of activating the gun for producing said one primary color when said first pulse is of a height or amplitude corresponding to the characteristic of said first element, and for activating the gun for said second primary color when said additional pulse is of a height or amplitude proportional to the energy of said second X-ray.

9. A color-coded mapping system comprising means for producing potentials corresponding to the position of a particle beam as it is repeatedly moved over a specimen to be analyzed, means for producing a short potential pulse each time an X-ray is detected whose height is proportional to the X-ray energy, means for sampling and holding signals representative of the position of said particle beam as it moves over said specimen, means for sampling and holding the short potential pulse occurring at the time each X-ray is detected, a hue modulator for producing bright-up pulses, a color cathode ray tube including three electron guns, each gun providing a primary color, means for activating said guns including a timing element providing a short electrical pulse enabling said hue modulator to activate said electron guns to produce a spot of light on the screen of said cathode ray tube, said hue modulator causing said electron guns to be activated in accordance with the height of each short potential pulse, and means for photographing the screen of said cathode ray tube to record said various colors, whereby only those preselected colors which are repeatedly produced at various locations on the screen of said cathode ray tube represent the elemental composition of said specimen when said preselected colors are photographically recorded.

10. A color-coded mapping method comprising the steps of directing a particle beam onto a specimen at one location to produce a first X-ray, the energy of which first X-ray is characteristic of a chemical element contained in said specimen at said one location, deriving a first electrical pulse signal the height of which pulse signal is proportional to the energy of said first X-ray, converting said first electrical pulse signal to a first color preselected in accordance with the height of said electrical pulse signal, said first color being representative of said element, shifting said particle beam to a second location on said specimen to produce a second X-ray, the energy of which second X-ray is characteristic of said chemical element when said chemical element is the same as the element at said one location and the energy of which said second X-ray is different when said chemical element is different from the element at said second location, deriving a second electrical pulse signal the height of which second electrical pulse signal is proportional to the energy of said second X-ray, converting said second electrical pulse signal to the same preselected color when said chemical element is the same as that at said first location and to a second color preselected in accordance with the height of said second electrical pulse signal when said element is different from that said first location, converting said electrical pulse signals to a second beam, directing said second beam at spaced locations onto a medium capable of producing said preselected color or colors when struck by said second beam, moving said first beam to additional locations over an area of said specimen, moving said second beam from various locations over an area of said medium, said medium being the screen of a color cathode ray tube having electron guns for producing the primary colors red, blue and green, said first preselected color constituting one of said primary colors and said second preselected color constituting one of said primary colors and said second preselected color constituting a second of said primary colors, activating the guns for producing said one primary color when said first electrical pulse signal is of a height corresponding to the characteristic of said first element, activating the gun for said second primary color when said additional electrical pulse signal is of a height proportional to the energy of said second X-ray, and activating both of said guns simultaneously for producing said first and second primary colors to provide a modified hue when said elements are chemically combined with each other, said hue being indicative of said chemically combined elements.

11. The system of claim 2 in which said detector consists of a large area silicon p-n junction.

12. The system of claim 11 in which said junction forms a large volume of depleted silicon, an X-ray incident on said junction interacting with one of the silicon atoms to release a high energy electron.

13. The system of claim 12 in which said means for deriving a second beam representative of the energy of said X-rays includes a pulse processor.

14. The system of claim 13 in which said pulse processor includes an amplifier, a pulse stretcher and a linear gate.

15. A color-coded mapping system comprising means for repeatedly scanning a specimen to produce a number of X-rays, the energy of some of which X-rays are characteristic of a chemical element contained in said specimen and others of which X-rays are not indicative of said chemical element, a single detector for generating a pulse of current having in each instance a height proportional to the detected X-ray energy, doing so for each X-ray striking said detector including generating a pulse of a height representative of said chemical element when said chemical element is present in said specimen, means for amplifying each pulse from said detector to provide amplified electrical pulses, each of said amplified pulses having a height corresponding to the energy of the X-ray from which it was derived, means for converting said amplified electrical pulses to a second particle beam, means for causing said second beam to repeatedly scan a medium capable of producing various colors, each color being in accordance with the height of an amplified pulse and hence a color in accordance with the energy of the X-ray from which it was derived which various colors include a color in accordance with the energy of those X-rays characteristics of said chemical element when said chemical element is present in said specimen, whereby said color representative of said chemical element will be repeatedly produced on said medium when said chemical element is present in said specimen.

16. A color-coded mapping method comprising the steps of repeatedly scanning a specimen to produce a number of X-rays, the energy of some of which X-rays are characteristic of a chemical element that may be contained in said specimen and others of which X-rays are not indicative of said chemical element, deriving various electrical signals representative of the various X-rays so produced, converting said various electrical signals to electrical pulses, each electrical pulse having a height corresponding to the energy of the X-ray from which it was derived, preselecting a color for the pulse height representative of said chemical element, converting said electrical pulses to a second particle beam, and causing said second beam to repeatedly scan a medium capable of producing said selected color and also those colors produced by said other X-rays, whereby said selected color is repeatedly produced on said medium when said chemical element is present in said specimen.

17. The method of claim 16 in which said medium includes a screen of a color cathode ray tube.

18. The method of claim 17 including the step of photographing the screen of said color cathode ray to record said selected color when repeatedly produced on said screen.

* * * * *